(12) United States Patent
Lee et al.

(10) Patent No.: US 7,791,964 B2
(45) Date of Patent: Sep. 7, 2010

(54) MEMORY SYSTEM AND METHOD ENSURING READ DATA STABILITY

(75) Inventors: Young-Min Lee, Suwon-si (KR); Han-Gu Sohn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 186 days.

(21) Appl. No.: 12/044,174

(22) Filed: Mar. 7, 2008

(65) Prior Publication Data
US 2008/0219066 A1 Sep. 11, 2008

(30) Foreign Application Priority Data
Mar. 8, 2007 (KR) ............... 10-2007-0023104

(51) Int. Cl.
*G11C 7/00* (2006.01)
(52) U.S. Cl. .............. 365/193; 365/189.15; 365/189.17
(58) Field of Classification Search ........................ None
See application file for complete search history.

(56) References Cited

U.S. PATENT DOCUMENTS

| 5,956,748 | A | 9/1999 | New | |
| 6,111,814 | A | 8/2000 | Schaefer | |
| 6,646,929 | B1* | 11/2003 | Moss et al. | 365/194 |
| 6,772,312 | B2 | 8/2004 | Mes | |
| 2001/0046163 | A1* | 11/2001 | Yanagawa | 365/194 |
| 2007/0047337 | A1* | 3/2007 | Iizuka | 365/193 |

FOREIGN PATENT DOCUMENTS

| JP | 10126595 | 5/1998 |
| KR | 1020060001497 A | 1/2006 |
| KR | 1020060087988 A | 8/2006 |

OTHER PUBLICATIONS

DDR2 SDRAM Specification, version JESD79-2B, Jan. 2005.*
DDR2 JEDEC Standard.*

* cited by examiner

*Primary Examiner*—Huan Hoang
*Assistant Examiner*—James G Norman
(74) *Attorney, Agent, or Firm*—Volentine & Whitt, PLLC

(57) ABSTRACT

A memory system and related method of operation are disclosed. The memory system includes a memory configured to generate a data strobe signal including "(n/2)+1" clock signals, where "n" is a number of base data blocks in read data synchronously transferred by the memory during a read operation, and a memory controller configured to receive the read data, receive the data strobe signal, delay the data strobe signal to generate a delayed data strobe signal, and synchronously output "n/2" sampled data blocks to a requesting device in relation to the delayed data strobe signal.

25 Claims, 7 Drawing Sheets

MEMORY SYSTEM AND METHOD ENSURING READ DATA STABILITY

CROSS-REFERENCE TO RELATED APPLICATIONS

This U.S. non-provisional patent application claims priority under 35 U.S.C. §119 to Korean Patent Application No. 10-2007-0023104, filed on Mar. 8, 2007, the subject matter of which is hereby incorporated by reference.

BACKGROUND OF THE INVENTION

The present invention relates to a memory system, and more particularly, to a memory system and a method for ensuring stability of data during a read operation.

Synchronous dynamic random access memory (SDRAM) operates in synchronization with a clock signal typically provided by a central processing unit (CPU). By synchronously operating in relation to a clock signal known to the CPU, a memory system incorporating the SDRAM may be accessed at high speed without wait time.

SDRAM is classified into single data rate SDRAM (SDR SDRAM) and double data rate SDRAM (DDR SDRAM). DDR SDRAM has a data transmission band that is twice broader than SDR SDRAM. For example, SDR SDRAM operates at 133 MHz and DDR SDRAM operates at 266 MHz.

Generally, SDR SDRAM and DDR SDRAM receive a read command and then output data after a predetermined output delay during a read operation. The output delay generally includes a valid output delay tSAC. The valid output delay tSAC determined generated by such factors such as pressure, volume, and temperature (PVT) and operating frequency. It may be shorter or longer than one clock period of the clock signal provided by the CPU.

DDR SDRAM typically includes a delay locked loop (DLL) circuit that is operated such that the valid output delay tSAC remains less than one clock period. However, the DLL circuit has relatively high power consumption. Mobile devices such as mobile phones and PDAs usually strive for reduced power consumption. Accordingly, the DDR SDRAM commonly used in mobile devices does not include a DLL circuit. Unfortunately, DDR SDRAM without the DLL circuit may not synchronize the valid output delay tSAC within one clock period. Thus, the valid output delay tSAC may become longer than the one clock period due to PVT, particularly where high frequency operation is desired.

FIGS. (FIGS.) 1 through 3 are read timing diagrams for a conventional DDR SDRAM operated within a typical memory system including a DDR SDRAM controller. The DDR SRAM controller reads data stored in the DDR SRAM during a defined read operation.

Referring to FIGS. 1 through 3, a DDR SRAM ("the memory") receives a read command RD from the DDR SRAM controller ("the memory controller") during the read operation. In response, the memory generates a data strobe signal DQS using a constituent strobe signal generator following a predetermined output delay. The output delay includes valid output delay tSAC and is expressed in terms of a column address strobe delay signal (CAS latency or "CL"), or one clock period (1clk)+tSAC. A system designer or end user may set the CL to be 2 clock periods or 3 clock periods, as desired. In the examples shown in FIGS. 1 through 3, the CL is assumed to be 2 clock periods.

During periods when the memory does not output data, the strobe signal generator maintains a floating state to reduce power consumption. However, when the memory performs a read operation, the strobe signal generator provides a data strobe signal having a rising edge following a pre-amble period. The strobe signal generator returns to a floating state following a post-amble period after the falling edge of the data strobe signal. Because contemporary memory device use a high frequency clock signal, the amplitude of the data strobe signal may become unstable due to an internal capacitance effect arising from the interaction of memory device components. Amplitude instability may cause temporal shifting in the rising and/or falling edges of the data strobe signal. Accordingly, conventional strobe signal generators increase the amplitude of the data strobe signal during the pre-amble and post-amble periods, in order to maintain proper temporal alignment of the rising and falling edges. In this manner, the conventional strobe signal generator seeks to ensure stability of the data strobe signal.

The memory is synchronized with the rising and falling edges of the data strobe signal DQS to output data to the memory controller. Additionally, the memory outputs the data strobe signal DQS to the memory controller.

The memory controller provides a predetermined delay to the data strobe signal DQS through a constituent delay circuit to smoothly perform sampling of the input data. The delay circuit typically shifts the data strobe signal provided by the memory by about 90°, but other delay values are possible.

The memory controller is synchronized with the 90°-shifted data strobe signal DQSin to sample data from the memory. The memory controller synchronously outputs sampled data DQin to an external circuit (e.g., a requesting device, such as a Central Processing Unit (CPU), a Digital Signal Processor (DSP), a hardware (H/W) engine, and I/O device, etc.) in relation to the rising edges r.e1 and r.e2 of the first two clock signal periods following a point determined by CL+1 (or CL+2, or CL+3). The sampled and synchronized output data DQin may thus be provided to the requested device. So, in the context of the foregoing approach, a user predefined clock signal period (e.g., CL+1, CL+2, and CL+3) determines when read data is provided to the memory controller.

FIG. 1 is a read operation timing diagram assuming a valid output delay tSAC of one clock period. In this case, the memory controller outputs the sampled data DQin synchronously with the rising edges r.e1 and r.e2 of the first two clock periods (clock signal CK) following the expiration of the clock signal period CL+1. The illustrated example shown in FIG. 1 assumes a valid output delay tSAC shorter than the one clock period 1clk. Therefore, the memory controller may output the sampled data DQin synchronously with the rising edges r.e1 and r.e2 of the first two clock periods CK following the expiration of the clock signal period CL+1.

FIG. 2 is a similar read operation timing diagram, except the valid output delay tSAC is now longer than one clock period, but shorter than two clock periods. In this case, the memory controller outputs the sampled data DQin synchronously with the rising edges r.e1 and r.e2 of the first two clock signals CK following expiration of the clock signal period CL+2.

FIG. 3 is yet another similar timing diagram for a read operation, except the valid output delay tSAC is longer than two clock periods but shorter than three clock periods. In this case, the memory controller outputs the sampled data DQin synchronously with the rising edges r.e1 and r.e2 of the first two clock signals CK following expiration of the clock signal period CL+3.

In a case where the output point of the sampled data DQin by the memory controller is defined in relation to a clock signal period of CL+1 (re. FIG. 1), the memory controller will properly output the sampled data DQin so long as the valid output delay tSAC is less than or equal to one clock period. However, as illustrated in FIGS. 2 and 3, if a maximum valid output delay tSAC is expected to be greater than one clock period, the synchronous output point for the sampled data DQin must be defined in relation to a longer clock signal period (e.g., CL+2 or CL+3). Where an established output point for the memory controller varies from the actual data performance, the memory controller may not properly output the sampled data DQin, or may output only a portion of the sampled data DQin. This outcome is true whether the output point is defined in relation a clock signal period CL+2, or a clock signal period of CL+3, where the valid output delay tSAC is greater than the period allowed by the clock signal period.

To resolve the above limitations, a user typically sets the output point for the sampled data DQin in the memory controller with the largest available clock signal period (i.e., CL+3 in the working example) in order to establish a data output point for the memory controller with greatest reliability. However, this precaution merely ensures that a requesting device receives its read data at the latest possible point in time relative to the operation of the memory and memory controller.

Were the memory to include a DLL circuit, as is the common case of personal computers, the valid output delay tSAC would always be less than or equal to one clock period. Hence, the operation of the memory and memory controller would be consistent with the example illustrated in FIG. 1, (i.e., the rising edge R.e of the data strobe signal would be set with the rising edge r.e of the clock signal CL, and the data output point for the memory controller would be defined in relation to a clock signal period CL+1).

However, this same can not be said for most memory devices incorporated in mobile devices. Here, because of the absence of a DLL, the valid output delay can not be ensured at less than or equal to one clock period. Accordingly, the rising edge R.e of the data strobe signal may be later than the rising edge r.e of the clock signal CK. The delay of the data strobe signal becomes relatively longer as the period of the clock signal CK becomes shorter at higher operating frequencies. Thus, as the period of the clock signal CK becomes shorter and the delay of the strobe signal becomes longer, the valid output delay tSAC becomes longer than one clock period (1 clk) and results illustrated in FIGS. 2 and 3 arise.

SUMMARY OF THE INVENTION

The present invention provides a memory system ensuring the stability of read data during a read operation and a related method of performing a read operation.

In one embodiment, the invention provides a memory system including; a memory configured to generate a data strobe signal including "(n/2)+1" clock signals, where "n" is a number of base data blocks in read data synchronously transferred by the memory during a read operation, and a memory controller configured to receive the read data, receive the data strobe signal, delay the data strobe signal to generate a delayed data strobe signal, and synchronously output "n/2" sampled data blocks to a requesting device in relation to the delayed data strobe signal.

In another embodiment, the invention provides a memory system including; a memory comprising a delay locked loop (DLL) circuit and configured to generate a data strobe signal including "(n/2)+1" clock signals, where "n" is a number of base data blocks in read data synchronously transferred by the memory during a read operation, wherein the DLL circuit synchronizes the data strobe signal with a rising edge of a clock signal provided by a requesting device, and a memory controller configured to receive the read data, receive the data strobe signal, delay the data strobe signal to generate a delayed data strobe signal, and synchronously output "n/2" sampled data blocks to the requesting device in relation to the delayed data strobe signal.

In another embodiment, the invention provides a method of performing a read operation in a memory system comprising a memory and a memory controller and providing read data to a requesting device, the method including; generating a data strobe signal including (n/2)+1 clock signals in the memory, where "n" is a number of base data blocks in the read data synchronously transferred by the memory to the memory controller during the read operation, receiving the data strobe signal in the memory controller and delaying the data strobe signal by a predetermined delay to generate a delayed data strobe signal, receiving the read data in the memory controller from the memory, separately synchronizing even and odd data blocks of the read data with the delayed data strobe signal in the memory controller, and synchronizing providing sampled data blocks comprising an even data block and an odd data block from the memory controller to the requesting device in relation to the delayed data strobe signal.

DESCRIPTION OF EMBODIMENTS

Hereinafter, an exemplary embodiment of the present invention will be described with reference to the accompanying drawings. The invention may, however, be variously embodied and should not be construed as being limited to only the illustrated embodiments.

Figure 4:
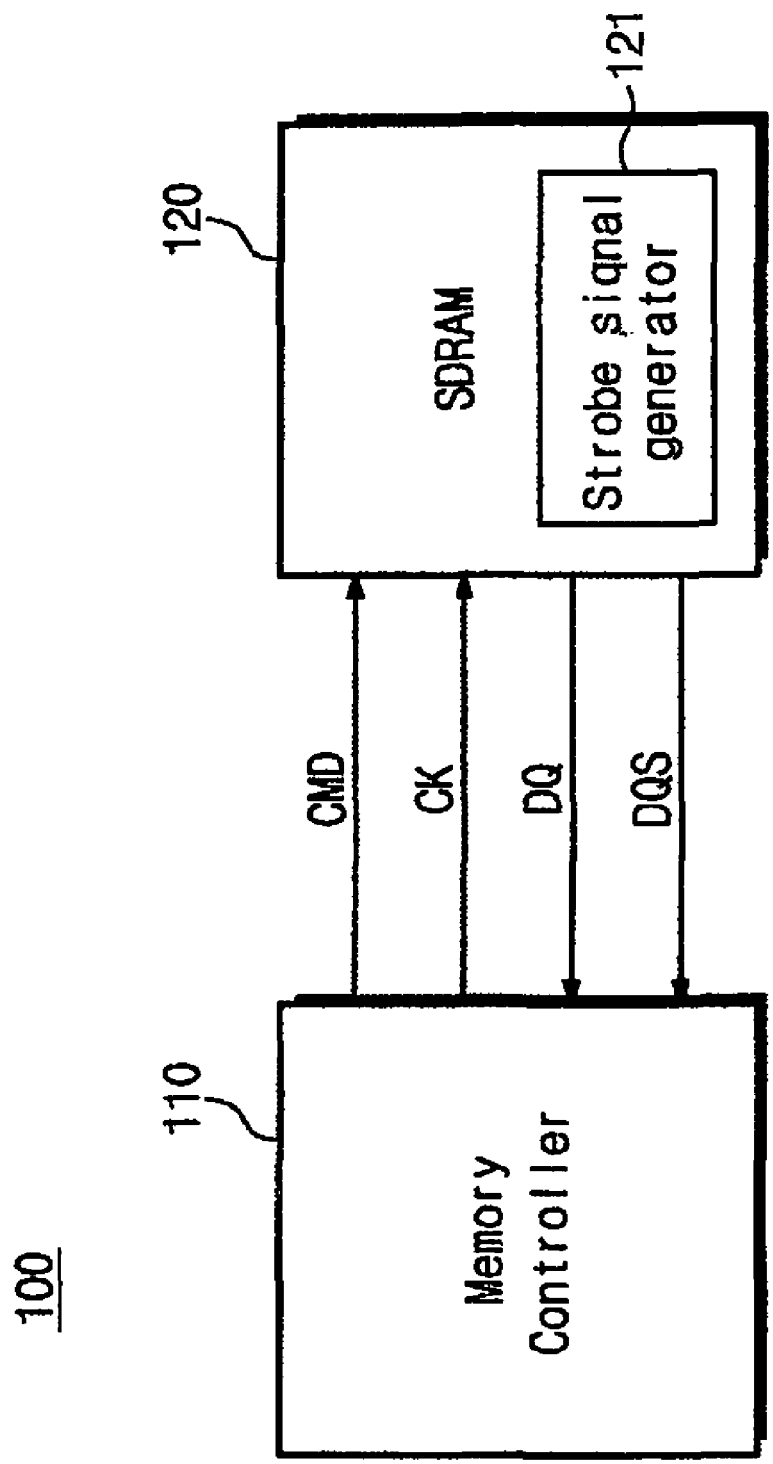
FIG. 4 is a general block diagram of a memory system according to an embodiment of the invention.

FIG. 4 is a block diagram of a memory system 100 according to an embodiment of the invention.

Referring to FIG. 4, memory system 100 includes a memory controller 110 and a memory 120. In the illustrated embodiment, memory controller 110 is assumed to be a double data rate synchronous dynamic random access memory (DDR SDRAM) controller, and memory 120 is assumed to be a DDR SDRAM. During a read operation, memory controller 110 provides a command CMD and a clock signal CK (possibly received from a read data requesting device) to memory 120.

Memory 120 generates a data strobe signal DQS in response to the applied read command CMD, and returns it to memory controller 110. Additionally, memory 120 provides the requested read data DQ to memory controller 110 synchronously with the data strobe signal DQS.

Memory controller 110 provides a predetermined delay to the data strobe signal DQS received from memory 120 by means of a delay logic circuit 1111 associated with an Input/Output (I/O) pin 111. (See, FIG. 5). The illustrated embodiment assumes that delay logic circuit 1111 imparts a 90° shift to the data strobe signal DQS received by memory controller 120, but those of ordinary skill in the art will recognize that any reasonable delay may be similarly imparted.

Thus, memory controller 110 shifts the data strobe signal DQS by about 90°, and samples the received read data DQ synchronously with the 90°-shifted data strobe signal DQS. Thereafter, memory controller 110 outputs the sampled data DQ synchronously with the 90°-shifted data strobe signal DQS to the requesting device.

Figure 5:
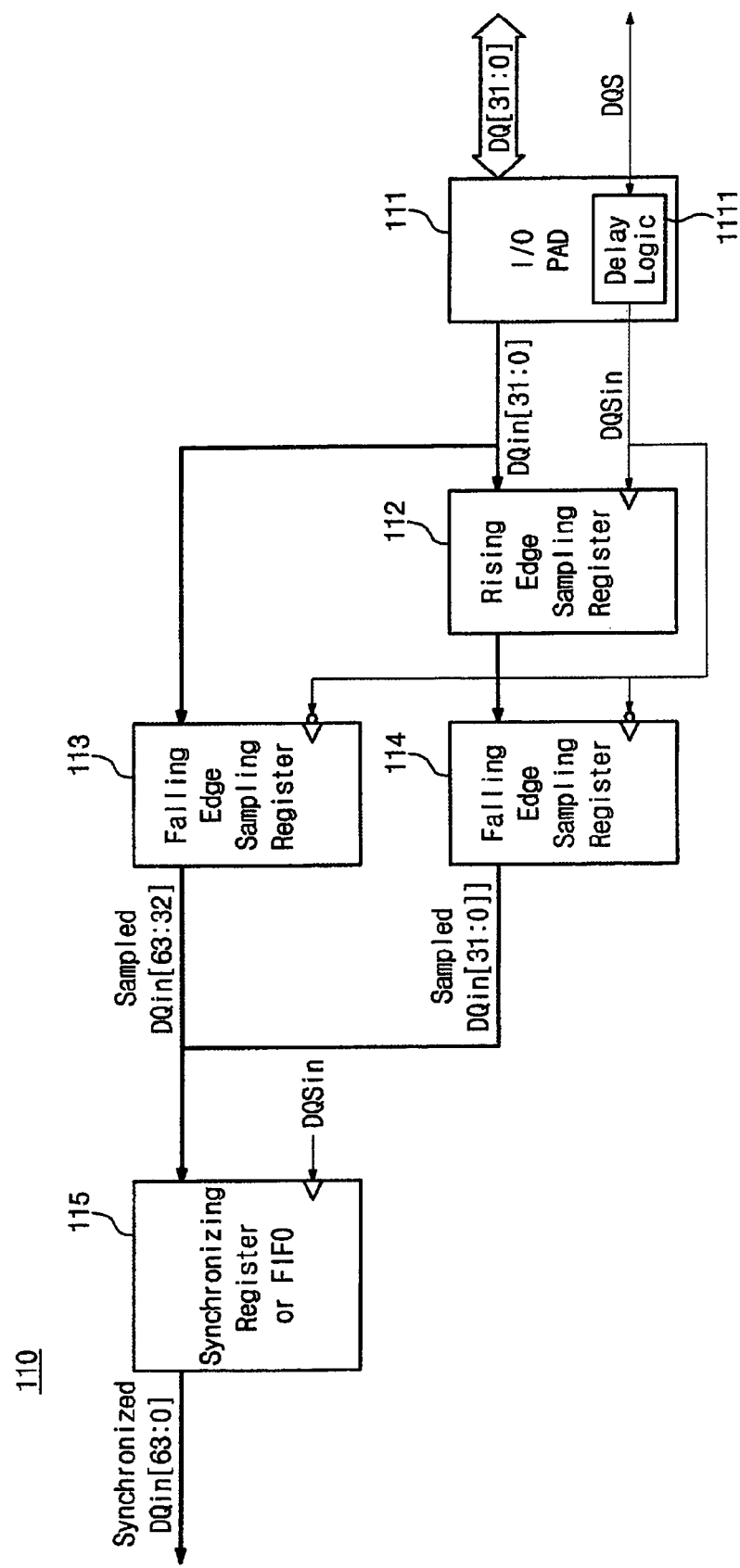
FIG. 5 is a block diagram further illustrating an exemplary flow of data between the SRAM and memory controller of FIG. 4.

FIG. 5 is a block diagram further illustrating one possible flow of data to and through memory controller 110 of FIG. 4.

Referring to FIG. 5, memory controller 110 comprises an I/O pad 111, a rising edge sampling register 112, two falling edge sampling registers 113 and 114, and a synchronizing register 115.

Synchronizing register 115 may be implemented with a first-in first-out (FIFO) circuit. First falling edge sampling register 113 and second falling edge sampling register 114 may be similarly implemented.

In the illustrated embodiment, I/O pad 111 includes the delay logic circuit 1111, but this may be separately provided between the I/O pad and rising edge sampling register 112 and falling edge sampling register 113. In certain related embodiments, delay logic circuit 1111 may include a delay locked loop (DLL).

I/O pad 111 receives read data DQ and the data strobe signal DQS from memory 120. Delay logic circuit 1111 imparts a predetermined delay (e.g., about 90°) to the data strobe signal DQS received from memory 120.

Rising edge sampling register 112 and first and second falling edge sampling registers 113 and 114 are synchronized with the 90°-shifted data strobe signal DQS to sample the read data DQ received through I/O pad 111.

Synchronizing register 115 is also synchronized with the 90°-shifted data strobe signal DQS to output the data sampled by rising edge sampling register 112 and first and second falling edge sampling registers 113 and 114 to the requesting device.

Figure 6:
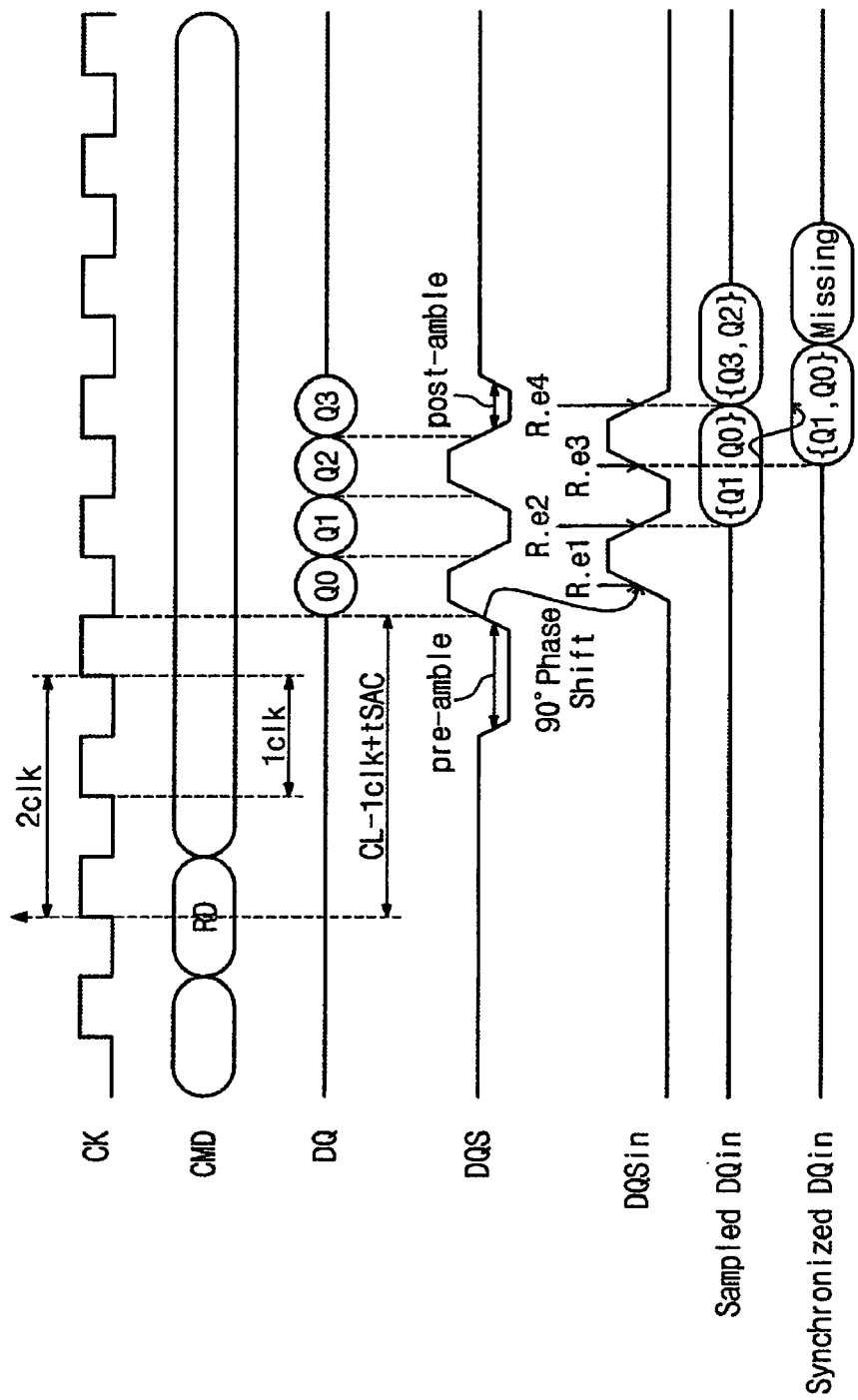
FIGS. 6 and 7 are read timing diagrams of a memory system according to an embodiment of the invention.
Figure 7:
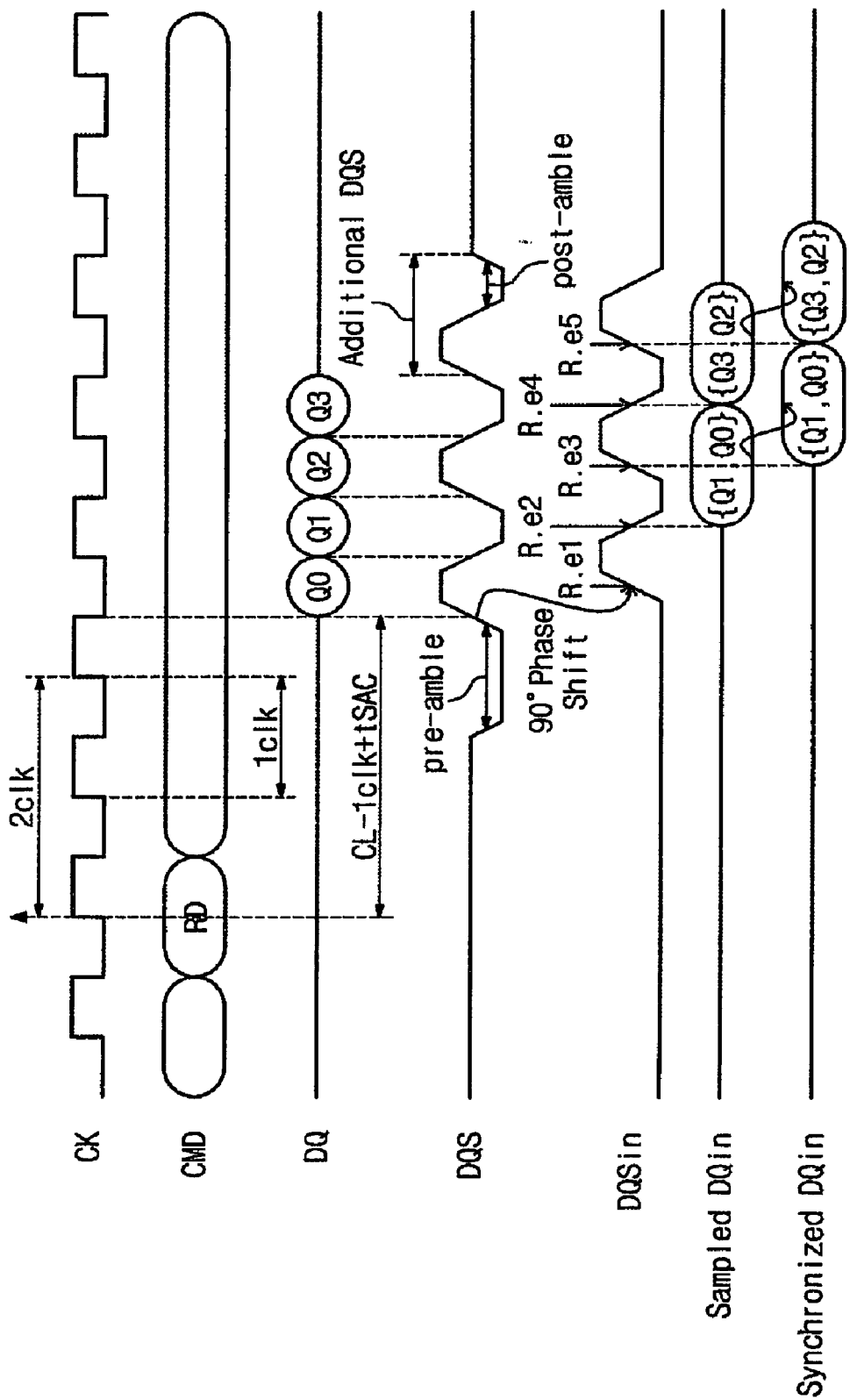

FIGS. 6 and 7 are read timing diagrams further illustrating the operation of a memory system according to an embodiment of the invention. Referring collectively to FIGS. 4 through 7, an exemplary read operation performed by the memory system will now be described.

During a read operation performed by memory system 100, memory 120 receives a read command RD and a clock signal CK from memory controller 110.

As illustrated in FIGS. 6 and 7, memory 120 generates a data strobe signal DQS in response to the read command RD following a predetermined delay. In the working example, memory 120 is assumed to include a strobe signal generator 121 providing the data strobe signal DQS. The operation of strobe signal generator 121 may be conventional in nature within the following embodiments.

Referring to FIG. 6, for n blocks of read data having a defined size (e.g., 32 bits) output by memory 120, the corresponding data strobe signal DQS may include 2/n clock signals, as described in some additional detail hereafter. Referring to FIG. 7, the data strobe signal DQS may include (2/n)+1 clock signals, as described hereafter.

As illustrated in FIGS. 6 and 7, the "data strobe signal output delay" between receipt of the read command and generation of the first rising edge of the data strobe signal is defined in relation to a valid output delay tSAC and in relation to a column address strobe delay signal defining a CAS latency (or "CL"). In the illustrated embodiment, the data strobe signal output delay is defined as CL−one clock period (1clk)+the valid output delay (tSAC). A user may pre-set the CL to 2 clock periods or 3 clock periods. However, the embodiments illustrated in FIGS. 6 and 7, assume a CL of 2 clock periods. Referring to the data strobe signal output delay shown in FIGS. 6 and 7, the valid output delay tSAC is longer than one clock period 1clk.

Memory 120 is synchronized with the rising edge and the falling edge of the data strobe signal DQS to output read data DQ to memory controller 110. Additionally, memory 120 outputs the data strobe signal DQS to memory controller 110.

Referring to the timing diagrams of FIGS. 6 and 7, memory 120 is synchronized with the rising edge and the falling edge of the data strobe signal DQS to output four (4) equal blocks of read data identified as Q0, Q1, Q2, and Q3. In one embodiment of the invention, each data block Q0, Q1, Q2, and Q3 includes 32-bits of read data from memory 120, but different data block definitions may be made in relation to the size and layout of memory 120, as is well understood in the art.

However, returning to the illustrated examples, four (4) blocks of data including 32-bits are respectively provided by memory 120 synchronously with the rising and falling edges of the data strobe signal DQS. As illustrated in FIG. 6, the data strobe signal DQS includes two clock edges which are generally sufficient to output four blocks of 32-bits. However, when the size of each row in memory 120 is larger than 128 bits, for example, or the number of data blocks increases significantly, the data strobe signal may need to include additional clock signals. For example, when each row of memory 120 stores 256-bit data, memory 120 may output eight (8) blocks of 32-bit data using a data strobe signal DQS defined by four (4) clock signals. Thus, as expressed above, when the number of (e.g.) 32 bit data blocks output by memory 120 is "n", the corresponding data strobe signal DQS generated by memory 120 may includes n/2 clock signals.

I/O pad 111 of memory controller 110 receives the read data DQ from memory 120, and provides the received read data DQ to rising edge sampling register 112 and first falling edge sampling register 113. Additionally, delay logic circuit 1111 associated with I/O pad 111 shifts the data strobe signal DQS received from memory 120 by about 90°. Delay logic 1111 provides the 90°-shifted data strobe signal DQSin to rising edge sampling register 112, first and second falling edge sampling registers 113 and 114, and synchronizing register 115. As illustrated in FIGS. 6 and 7, delayed data strobe signal DQSin is shifted by about 90° with respect to the data strobe signal DQS.

Rising edge sampling register 112 samples "even" data blocks (Q0 and Q2) among the read data blocks DQ synchronously with the rising edges R.e1 and R.e3 of the delayed data strobe signal DQSin, respectively. Rising edge sampling register 112 does not sample the read data DQ at the falling edges R.e2 and R.e4 of the delayed data strobe signal DQSin. Accordingly, "odd" data blocks (Q1 and Q3) are not sampled in rising edge sampling register 112, but even data blocks (Q0 and Q2) are sampled by rising edge sampling register 112 and provided to second falling edge sampling register 114.

First falling edge sampling register 113 samples each odd data block (Q1 and Q3) among the read data DQ synchronously with the rising edges R.e2 and R.e4 of the delayed data strobe signal DQSin, respectively. First falling edge sampling register 113 does not sample the read data DQ at the rising edges R.e1 and R.e3 of the delayed data strobe signal DQSin. Accordingly, the even data blocks (Q0 and Q2) are not sampled in first falling edge sampling register 113, but odd data blocks (Q1 and Q3) are sampled by first falling edge sampling register 113 and synchronously provided to synchronizing register 115.

Second falling edge sampling register 114 receives the even data blocks sampled by rising edge sampling register 112. Second falling edge sampling register 114 samples each even data block (Q0 and Q2) synchronously with the rising edges R.e2 and R.e4 of the delayed data strobe signal DQSin, respectively. The data sampled by second falling edge sampling register 114 is provided to synchronizing register 115.

Since memory 120 in the working example is a DDR SRAM, each data block Q0, Q1, Q2, and Q3 is synchronized with the rising edge and falling edge of the data strobe signal DQS and then output. However, rising edge sampling register 112 and first and second falling edge sampling registers 113 and 114 of memory controller 110 sample the data blocks Q0, Q1, Q2, and Q3 at the rising edge or the falling edge of the delayed data strobe signal DQSin.

Thus, the (assumed) data blocks Q0, Q1, Q2, and Q3 of 32-bit data are sampled to 64 bits and then output through rising edge sampling register 112 and first and second falling edge sampling registers 113 and 114. Accordingly, the sampled odd data blocks Q1 and Q3 output from first falling edge sampling register 113 and the sampled even data blocks Q0 and Q2 output from second falling edge sampling register 114 may be combined on a 64-bit wide bus and provided to synchronizing register 115.

Thus, the sampled odd data blocks Q1 and Q3 output from first falling edge sampling register 113 constitute an upper 32-bits of the 64 bits of sampled read data, and the sampled even data blocks Q0 and Q2 output from second falling edge sampling register 114 constitute a lower 32-bits of the 64 bits of sampled read data. Consequently, as illustrated in FIGS. 6 and 7, the data Q0, Q1, Q2, and Q3 are sampled at the falling edge R.e2 and R.e4 of the delayed data strobe signal DQSin and provided to synchronizing register 115 as two (2) sampled data blocks of 64-bits each melded from a first odd data block and a first even data block (Q1 and Q0), and from a second odd data block and a second even data block (Q3 and Q2), respectively.

Synchronizing register 115 is synchronized with the rising edge of the delayed data strobe signal DQSin to output the two (2) sampled 64-bit data blocks Q1 and Q0, and Q3 and Q2. As illustrated in FIG. 6, in an embodiment wherein the data strobe signal DQS and the corresponding delayed data strobe signal DQSin includes has two clock signals, synchronizing register 115 is may be synchronized with the rising edge R.e3 of the delayed data strobe signal DQSin to output a first sampled (64 bit) data Q1 and Q0. However, synchronizing register 115 does not have access to another rising edge of the delayed data strobe signal DQSin in order to synchronously output the second sampled (64-bit) data block Q3 and Q2.

In this case, the delayed data strobe signal DQSin may further include an additional clock signal (i.e., 1+n/2) in order to synchronously output the second sampled (64 bit) data block Q3 and Q2. Accordingly, as illustrated in FIG. 7, memory 120 may generate a data strobe signal DQS including three clocks.

As described above, the number of clocks forming a competent data strobe signal DQS, as generated by memory 120, is n/2, where "n" is the number of "base" data blocks being synchronously transferred from a memory to a corresponding memory controller. In the preceding examples, a base data block was defined with a size of 32 bits, but any reasonable size may be used. However, further use of the data strobe signal DQS (or a delayed data strobe signal derived from the data strobe signal) to synchronously output a "sampled" data block derived from two base data blocks from the memory controller to the requesting device requires the additional use of another clock signal. Hence, a n/2+1 number of clock signals is used to define a fully competent data strobe signal in a memory system according to an embodiment of the invention.

Returning to the illustrated example of FIG. 7, memory controller 110 is synchronized with the rising edge R.e3 and R.e5 of the delayed data strobe signal DQSin to output the sampled (64 bit) data blocks (Q1+Q0) and (Q3+Q2).

The foregoing assumes that synchronizing register 115 is not synchronized with a clock signal provided by the requesting device. As described in the background of the invention, even if the data output point of the memory controller is determined to be one of clock signal periods CL+1 and CL+3, memory controller 110 is not synchronized with this clock signal, but is synchronized with the data strobe signal DQSin generated in relation to the read data.

Figure 1:
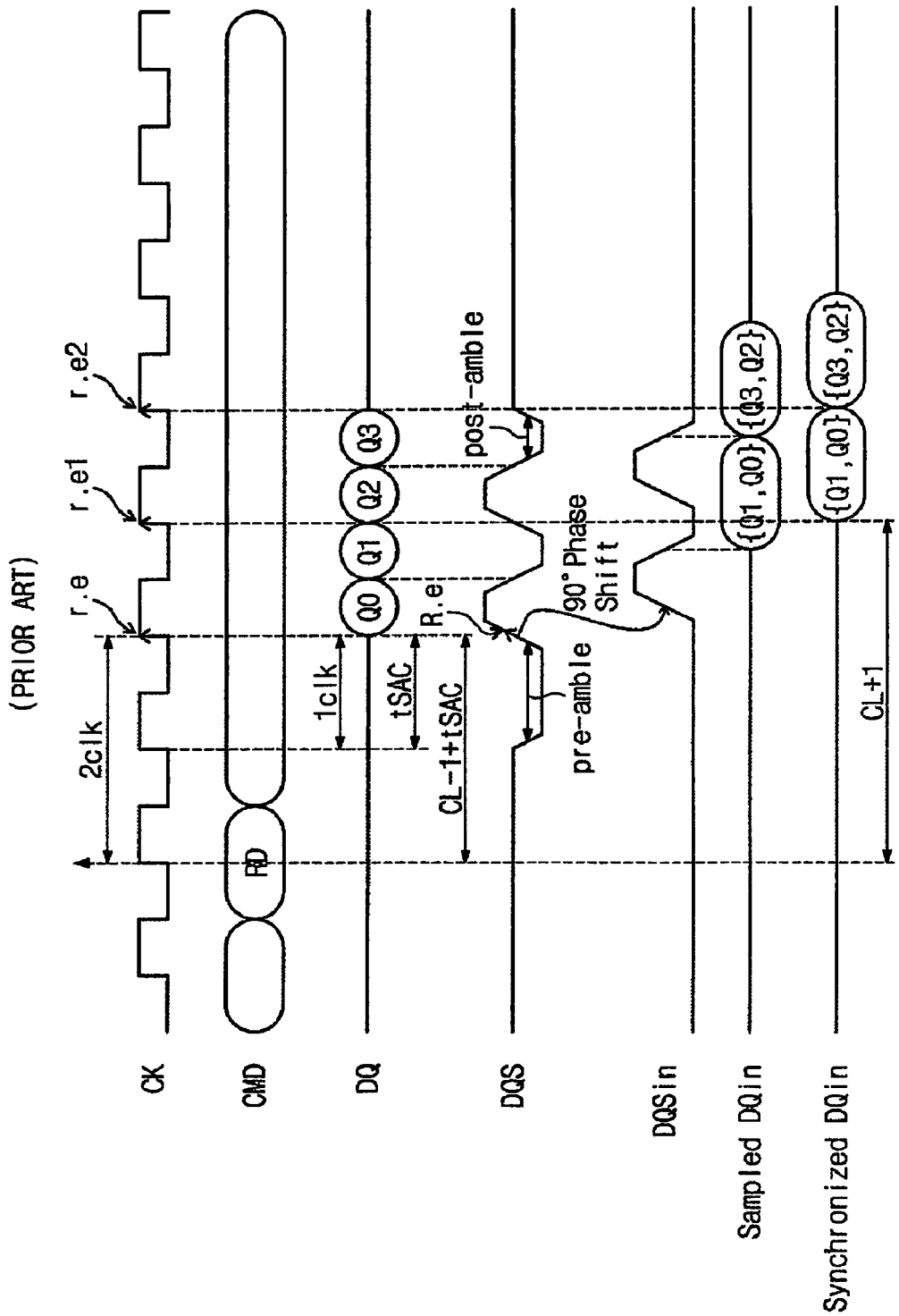
FIGS. 1 through 3 are read timing diagrams for a conventional SDRAM.
Figure 2:
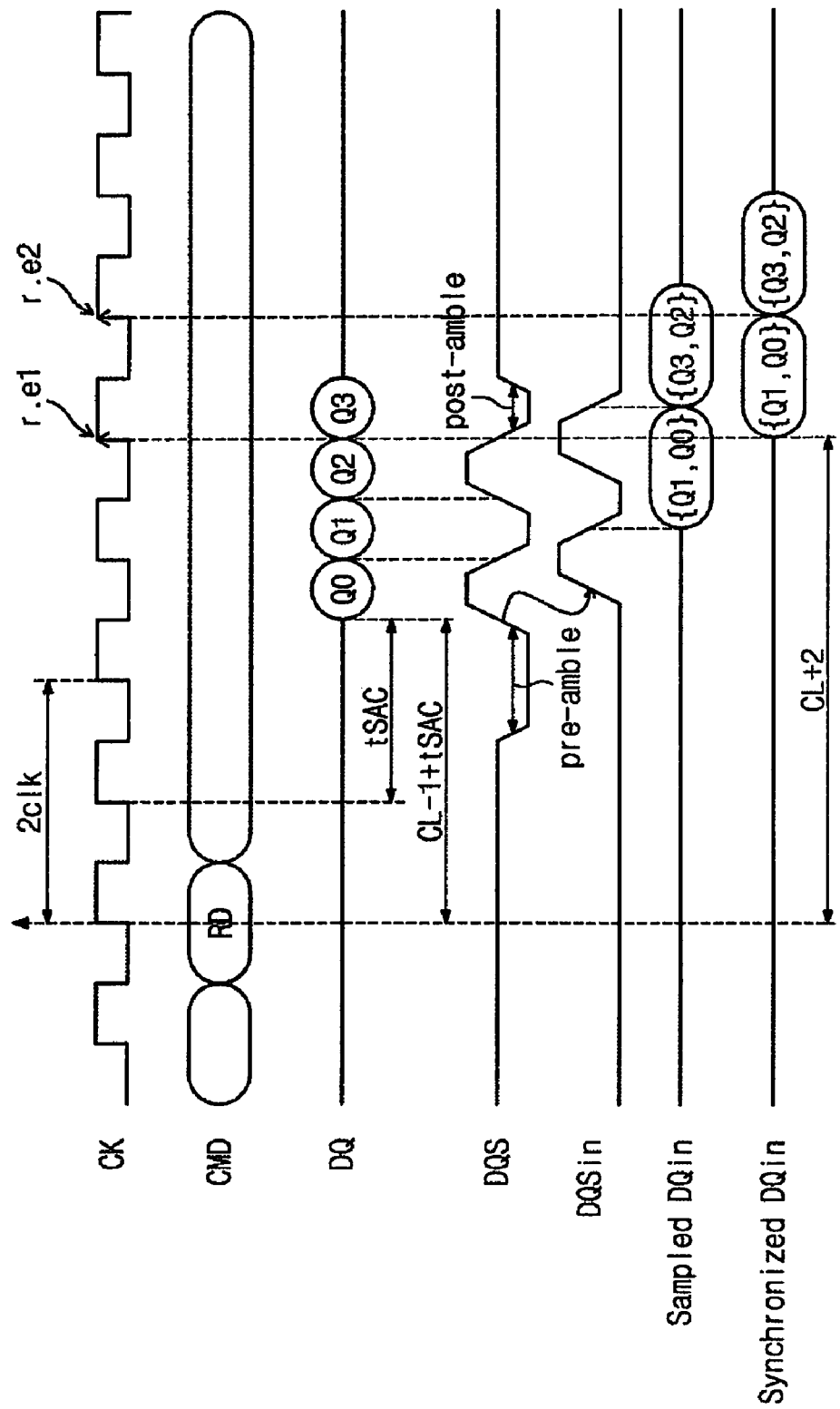
Figure 3:
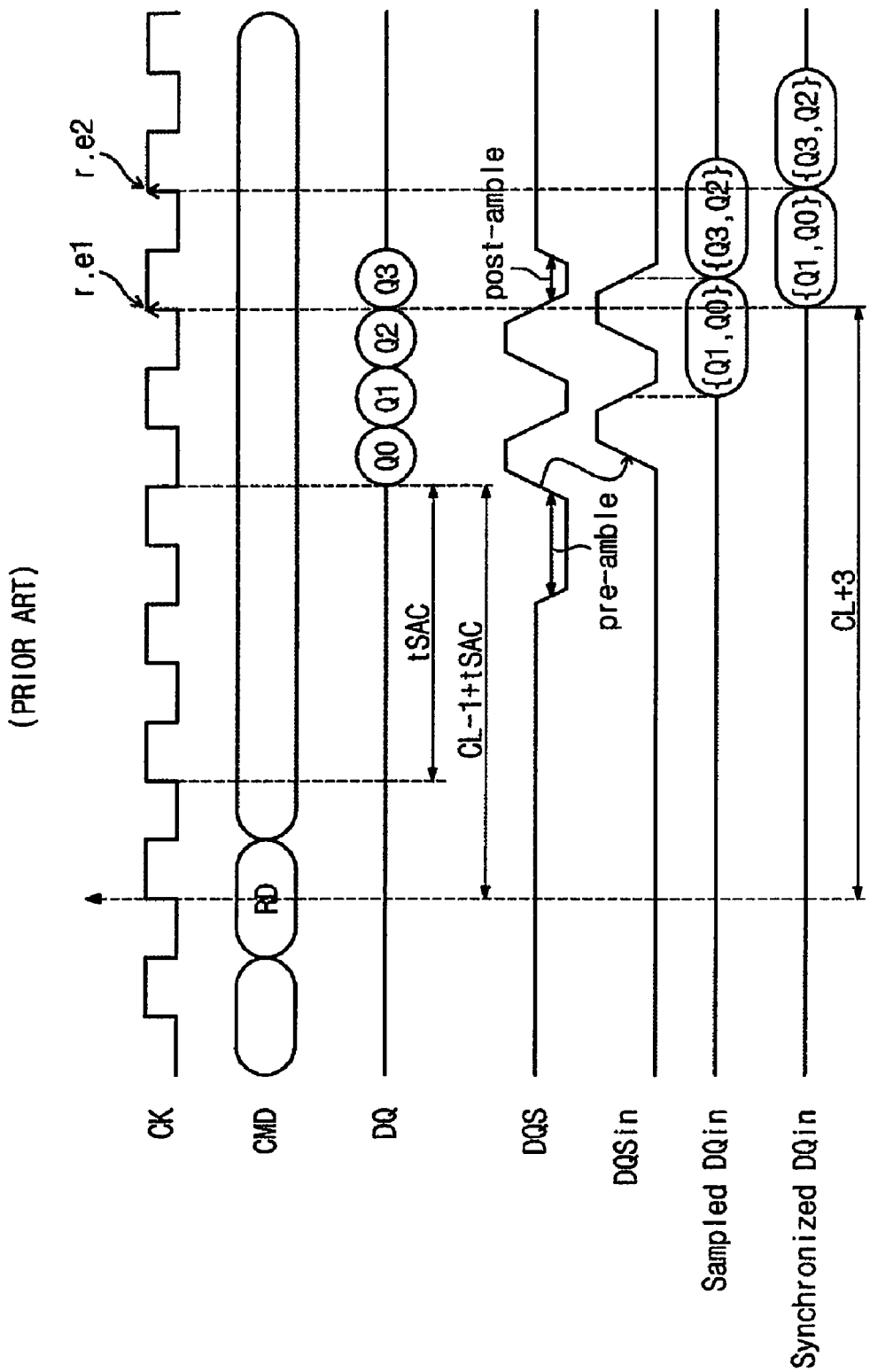

That is, assume that the data output point of memory controller 110 is determined in relation to a clock signal period of CL+1 by a user. At this point, when the valid output delay tSAC is longer than one clock period due to variations in (e.g.) pressure, volume, and temperature (PVT) as a function of operating frequency (illustrated in FIGS. 2 and 3), the memory controller nonetheless operates synchronously with a clock signal, as described in the background of the invention. In contrast, a memory controller consistent with an embodiment of the invention is synchronized with the data strobe signal DQSin output in relation to the sampled read data DQin, regardless of the predetermined clock signal period CL+1 even if the valid output delay tSAC is longer than one clock period. Accordingly, memory controller 110 normally outputs the valid data.

The foregoing memory system ensures the stability of the read data during a read operation.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope of the present invention is to be determined by the broadest permissible interpretation of the following claims and their equivalents.

What is claimed is:

1. A memory system comprising:
  a memory configured to generate a data strobe signal including "(n/2)+1" clock signals, where "n" is a number of base data blocks in read data synchronously transferred by the memory during a read operation; and
  a memory controller configured to receive the read data, receive the data strobe signal, delay the data strobe signal to generate a delayed data strobe signal, and synchronously output "n/2" sampled data blocks to a requesting device in relation to the delayed data strobe signal.

2. The memory system of claim 1, wherein the memory is further configured to output the "n" base data blocks to the memory controller synchronously with respect to a rising edge and a falling edge of the data strobe signal.

3. The memory system of claim 1, wherein the memory controller is further configured to output the "n/2" sampled data blocks to the requesting device synchronously with a rising edge of the delayed data strobe signal.

4. The memory system of claim 1, wherein the memory is a double data rate synchronous dynamic random access memory (DDR SDRAM).

5. The memory system of claim 4, wherein the memory controller is a DDR SDRAM controller.

6. The memory system of claim 1, wherein the memory controller comprises:

an input/output (I/O) pad configured to receive the read data and the data strobe signal;

a delay logic circuit configured to provide the predetermined delay to the data strobe signal;

a rising edge sampling register configured to receive read data from the I/O pad, and sample even data blocks in the "n" base data blocks synchronously with a rising edge of the delayed data strobe signal;

a first falling edge sampling register configured to receive read data from the I/O pad, and sample odd data blocks in the "n" base data blocks synchronously with a falling edge of the delayed data strobe signal;

a second falling edge sampling register configured to receive the even data blocks from the rising edge sampling register and synchronize the sampled even data blocks data with the falling edge of the delayed data strobe signal; and a synchronizing register configured to receive a sampled data block derived from an odd data block provided by the first falling edge sampling register and an even data block provided by the second falling edge sampling register, and synchronously provide the sampled data block to the requesting device.

7. The memory system of claim 6, wherein the odd data block provided by the first falling sampling register comprises upper bits of the sampled data block output by the synchronizing register.

8. The memory system of claim 7, wherein the even data block provided by the second falling sampling register comprises lower bits of the sampled data block output by the synchronizing register.

9. The memory system of claim 6, wherein the I/O pad is further configured to incorporate the delay logic circuit.

10. The memory system of claim 9, wherein the delay logic circuit is a delay locked loop (DLL) circuit.

11. The memory system of claim 6, wherein the synchronizing register comprises a first-in first-out (FIFO) circuit.

12. A memory system comprising:

a memory comprising a delay locked loop (DLL) circuit and configured to generate a data strobe signal including "(n/2)+1" clock signals, where "n" is a number of base data blocks in read data synchronously transferred by the memory during a read operation, wherein the DLL circuit synchronizes the data strobe signal with a rising edge of a clock signal provided by a requesting device; and a memory controller configured to receive the read data, receive the data strobe signal, delay the data strobe signal to generate a delayed data strobe signal, and synchronously output "n/2" sampled data blocks to the requesting device in relation to the delayed data strobe signal.

13. The memory system of claim 12, wherein the memory is further configured to output the "n" base data blocks to the memory controller synchronously with respect to a rising edge and a falling edge of the data strobe signal.

14. The memory system of claim 12, wherein the memory controller is further configured to output the "n/2" sampled data blocks to the requesting device synchronously with a rising edge of the delayed data strobe signal.

15. The memory system of claim 12, wherein the memory is a double data rate synchronous dynamic random access memory (DDR SDRAM).

16. The memory system of claim 15, wherein the memory controller is a DDR SDRAM controller.

17. The memory system of claim 12, wherein the memory controller comprises:

an input/output (I/O) pad configured to receive the read data and the data strobe signal;

a delay logic circuit configured to provide the predetermined delay to the data strobe signal;

a rising edge sampling register configured to receive read data from the I/O pad, and sample even data blocks in the "n" base data blocks synchronously with a rising edge of the delayed data strobe signal;

a first falling edge sampling register configured to receive read data from the I/O pad, and sample odd data blocks in the "n" base data blocks synchronously with a falling edge of the delayed data strobe signal;

a second falling edge sampling register configured to receive the even data blocks from the rising edge sampling register and synchronize the sampled even data blocks data with the falling edge of the delayed data strobe signal; and a synchronizing register configured to receive a sampled data block derived from an odd data block provided by the first falling edge sampling register and an even data block provided by the second falling edge sampling register, and synchronously provide the sampled data block to the requesting device.

18. A method of performing a read operation in a memory system comprising a memory and a memory controller and providing read data to a requesting device, the method comprising:

generating a data strobe signal including (n/2)+1 clock signals in the memory, where "n" is a number of base data blocks in the read data synchronously transferred by the memory to the memory controller during the read operation;

receiving the data strobe signal in the memory controller and delaying the data strobe signal by a predetermined delay to generate a delayed data strobe signal;

receiving the read data in the memory controller from the memory;

separately synchronizing even and odd data blocks of the read data with the delayed data strobe signal in the memory controller; and synchronizing providing sampled data blocks comprising an even data block and an odd data block from the memory controller to the requesting device in relation to the delayed data strobe signal.

19. The method of claim 18, further comprising:

prior to receiving the read data in the memory controller from the memory, synchronizing the read data with a rising edge and a falling edge of the data strobe signal in the memory.

20. The method of claim 18, wherein receiving the read data in the memory controller from the memory comprises synchronizing of the received read data with a rising edge of the delayed data strobe signal.

21. The method of claim 18, wherein the memory is double data rate synchronous dynamic random access memory (DDR SDRAM).

22. The method of claim 18, wherein separately synchronizing even and odd data blocks with the delayed data strobe signal comprising:

sampling the even data blocks in a rising edge sampling register synchronously with a rising edge of the delayed data strobe signal;

sampling the odd data blocks in a first falling edge sampling register synchronously with a falling edge of the delayed data strobe signal;

sampling the even data blocks output by the rising edge sampling register in a second falling edge sampling register synchronously with the falling edge of the delayed data strobe signal; and receiving a sampled data block comprising an odd data block and an even data block in a synchronizing register, and outputting the sampled data block to the requesting device synchronously with the delayed data strobe signal.

23. The memory system of claim 1, wherein the memory receives a read command from the memory controller and subsequently generates the data strobe signal after a data strobe signal output delay, wherein the data strobe signal output delay is defined as CL−1 clk+tSAC, wherein clk is a clock period, CL is a column address strobe (CAS) latency equal to 2 clk, and tSAC is a valid output delay of the memory greater than 1 clk.

24. The memory system of claim 12, wherein the memory receives a read command from the memory controller and subsequently generates the data strobe signal after a data strobe signal output delay, wherein the data strobe signal output delay is defined as CL−1 clk+tSAC, wherein clk is a clock period, CL is a column address strobe (CAS) latency equal to 2 clk, and tSAC is a valid output delay of the memory greater than 1 clk.

25. The method of claim 18, wherein the memory receives a read command from the memory controller and subsequently generates the data strobe signal after a data strobe signal output delay, wherein the data strobe signal output delay is defined as CL−1 clk+tSAC, wherein clk is a clock period, CL is a column address strobe (CAS) latency equal to 2 clk, and tSAC is a valid output delay of the memory greater than 1 clk.

* * * * *